United States Patent
De Silva et al.

(10) Patent No.: US 10,656,527 B2
(45) Date of Patent: May 19, 2020

(54) PATTERNING MATERIAL FILM STACK WITH HARD MASK LAYER CONFIGURED TO SUPPORT SELECTIVE DEPOSITION ON PATTERNED RESIST LAYER

(71) Applicant: International Business Machines Corporation, Armonk, NY (US)

(72) Inventors: Ekmini Anuja De Silva, Slingerlands, NY (US); Indira Seshadri, Niskayuna, NY (US); Jing Guo, Niskayuna, NY (US); Ashim Dutta, Albany, NY (US); Nelson Felix, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 104 days.

(21) Appl. No.: 15/850,192

(22) Filed: Dec. 21, 2017

(65) Prior Publication Data
US 2019/0196340 A1 Jun. 27, 2019

(51) Int. Cl.
*G03F 7/40* (2006.01)
*G03F 7/20* (2006.01)
(Continued)

(52) U.S. Cl.
CPC ............... *G03F 7/40* (2013.01); *G03F 1/22* (2013.01); *G03F 1/54* (2013.01); *G03F 7/70033* (2013.01);
(Continued)

(58) Field of Classification Search
CPC ..................................................... G03F 7/40
See application file for complete search history.

(56) References Cited

U.S. PATENT DOCUMENTS

| 6,783,914 B1 | 8/2004 | Fedynyshyn |
| 7,005,386 B1 | 2/2006 | Bell et al. |
(Continued)

FOREIGN PATENT DOCUMENTS

| JP | 4273778 B2 | 8/2004 |
| JP | 2011215315 A | 10/2011 |

OTHER PUBLICATIONS

G. Gay et al., "CMOS Compatible Strategy Based on Selective Atomic Layer Deposition of a Hard Mask for Transferring Block Copolymer Lithography Patterns," Nanotechnology, Oct. 29, 2010, 7 pages, vol. 21, No. 43.
(Continued)

*Primary Examiner* — Kathleen Duda
(74) *Attorney, Agent, or Firm* — Vazken Alexanian; Ryan, Mason & Lewis, LLP (57) ABSTRACT

A lithographic patterning method includes forming a multi-layer patterning material film stack on a semiconductor substrate. Forming the patterning material film stack more particularly includes forming a hard mask layer and forming a resist layer over the hard mask layer. The hard mask layer is configured to support selective deposition of a metal-containing layer on the resist layer, the selective deposition of the metal-containing layer on the resist layer occurring after pattern development. The method further includes exposing the multi-layer patterning material film stack to patterning radiation to form a desired pattern in the resist layer, developing the pattern formed in the resist layer, and selectively depositing the metal-containing layer on the developed pattern in the resist layer. The selective deposition avoids deposition of the metal-containing layer on portions of the hard mask layer corresponding to respective openings in the resist layer.

20 Claims, 4 Drawing Sheets

(51) Int. Cl.
  *H01L 21/308* (2006.01)
  *H01L 21/027* (2006.01)
  *G03F 1/22* (2012.01)
  *H01L 21/033* (2006.01)
  *G03F 1/54* (2012.01)

(52) U.S. Cl.
  CPC ........ *H01L 21/027* (2013.01); *H01L 21/0332* (2013.01); *H01L 21/3081* (2013.01)

(56) References Cited

U.S. PATENT DOCUMENTS

| | | |
|---|---|---|
| 8,084,087 B2 | 12/2011 | Bent et al. |
| 8,883,374 B2 | 11/2014 | Altamirano Sanchez |
| 9,690,185 B2 | 6/2017 | Yaegashi |
| 2013/0256265 A1 | 10/2013 | Darling et al. |
| 2016/0244557 A1* | 8/2016 | Vora .................. G03F 7/0002 |

OTHER PUBLICATIONS

F.S.M. Hashemi et al., "A New Resist for Area Selective Atomic and Molecular Layer Deposition on Metal—Dielectric Patterns," The Journal of Physical Chemistry, 2014, pp. 10957-10962.

G.J. Burek et al., "Height-Selective Etching for Regrowth of Self-Aligned Contacts Using MBE," Journal of Crystal Growth, 2009, pp. 1984-1987, vol. 311.

A. Haider et al., "Area-Selective Atomic Layer Deposition Using an Inductively Coupled Plasma Polymerized Fluorocarbon Layer: A Case Study for Metal Oxides," The Journal of Physical Chemistry, Nov. 1, 2016, pp. 26393-26401, vol. 120, No. 46.

D.W. Carr et al., High-Selectivity Pattern Transfer Processes for Self-Assembled Monolayer Electron Beam Resists, Journal of Vacuum Science & Technology A: Vacuum, Surfaces, and Films, Feb. 1997, 1 page, vol. 15.

English translation for Japanese Application No. JP2011215315A.
English translation for Japanese Application No. JP2004235406A.
List of IBM Patents or Patent Applications Treated as Related.

* cited by examiner

PATTERNING MATERIAL FILM STACK WITH HARD MASK LAYER CONFIGURED TO SUPPORT SELECTIVE DEPOSITION ON PATTERNED RESIST LAYER

BACKGROUND

The present application relates to manufacturing of semiconductor integrated circuits, and more particularly to patterning of semiconductor integrated circuit features using lithography processes. As part of the ongoing world-wide effort to shrink integrated circuit device dimensions, a variety of single-pattern and multiple-pattern lithography processes based on deep ultraviolet (DUV) radiation wavelengths such as 193 nanometers (193 nm) have come into widespread use, although further extension of such arrangements to the patterning of features at production nodes below 10 nm may be problematic. Recent development of extreme ultraviolet (EUV) lithography processes using wavelengths such as 13.5 nm are expected to facilitate the accurate patterning of features at sub-10 nm production nodes, but there remain significant difficulties in the practical implementation of EUV processes. For example, conventional techniques in some cases fail to provide a resist layer that exhibits sufficient etch selectivity relative to an underlying hard mask layer. This can lead to pattern transfer defects such as line breaks due to resist thinning during an etching process. Additionally, elimination of line bridge defects caused by scumming of EUV resist between lines generally requires a resist descum process after lithographic pattern development which further reduces resist thickness available for hard mask etch.

SUMMARY

Illustrative embodiments of the invention provide a hard mask layer for use in a patterning material film stack in an EUV lithography process. The hard mask layer is particularly configured so as to support selective deposition of a metal-containing layer on a developed pattern in an overlying resist layer in the patterning material film stack. Such an arrangement can allow for increased height of the resist layer, as well as enhanced etch selectivity and associated improvements in pattern transfer between the resist layer and the hard mask layer. This can in turn lead to lower defect rates in lithographic patterning and corresponding reductions in integrated circuit manufacturing costs.

In one embodiment, a lithographic patterning method comprises forming a multi-layer patterning material film stack on a semiconductor substrate. Forming the patterning material film stack more particularly comprises forming a hard mask layer and forming a resist layer over the hard mask layer. The hard mask layer is configured to support selective deposition of a metal-containing layer on the resist layer, the selective deposition of the metal-containing layer on the resist layer occurring after pattern development. The method further comprises exposing the multi-layer patterning material film stack to patterning radiation to form a desired pattern in the resist layer, developing the pattern formed in the resist layer, and selectively depositing the metal-containing layer on the developed pattern in the resist layer, wherein the selective deposition avoids deposition of the metal-containing layer on portions of the hard mask layer corresponding to respective openings in the resist layer, responsive to configuration of the hard mask layer. The method also comprises etching the hard mask layer in accordance with the developed pattern, and removing remaining portions of at least one of the resist layer and the metal-containing layer.

By way of example, the hard mask layer in some embodiments comprises a grafted self-assembled monolayer configured to inhibit deposition of the metal-containing layer. Additionally or alternatively, the hard mask layer can comprise a grafted polymer brush material configured to inhibit deposition of the metal-containing layer.

In some embodiments, the hard mask layer may comprise a surface region pretreated with a material that inhibits deposition of the metal-containing layer. Such pretreatment illustratively occurs prior to formation of the resist layer over the pretreated surface region of the hard mask layer.

In another embodiment, a semiconductor structure comprises a semiconductor substrate and a multi-layer patterning material film stack formed on the semiconductor substrate. The patterning material film stack comprises at least a hard mask layer and a resist layer formed over the hard mask layer. The hard mask layer is configured to support selective deposition of a metal-containing layer on a developed pattern of the resist layer through inclusion in the hard mask layer of one or more materials inhibiting deposition of the metal-containing layer on portions of the hard mask layer corresponding to respective openings in the resist layer.

In a further embodiment, a multi-layer patterning material film stack comprises a hard mask layer and a resist layer formed over the hard mask layer. The hard mask layer is configured to support selective deposition of a metal-containing layer on a developed pattern of the resist layer through inclusion in the hard mask layer of one or more materials inhibiting deposition of the metal-containing layer on portions of the hard mask layer corresponding to respective openings in the resist layer.

DETAILED DESCRIPTION

Illustrative embodiments are described herein in the context of EUV lithography processes and associated patterning material film stacks and hard mask layers. However, it is to be understood that embodiments of the invention are not limited to these illustrative arrangements, but are instead more broadly applicable to a wide variety of different lithography processes, patterning material film stacks, hard mask layers and other features and functionality. For example, other embodiments are not limited to use with any particular single-pattern or multiple-pattern EUV lithography process but can be applied to a wide variety of other types of lithography processes, including both single-pattern and multiple-pattern DUV lithography processes. Also, the particular arrangements of layers utilized within the patterning material film stack can be varied in other embodiments. Moreover, the particular components of the hard mask layer and its manner of formation can be varied in other embodiments. These and numerous other variations in the disclosed arrangements will be apparent to those skilled in the art.

Illustrative embodiments involve forming a hard mask layer that is specifically configured to support selective deposition of a metal-containing layer on a developed pattern in an overlying resist layer in the patterning material film stack. For example, the hard mask layer in some embodiments comprises a grafted self-assembled monolayer configured to inhibit deposition of a metal-containing layer. Additionally or alternatively, the hard mask layer can comprise a grafted polymer brush material configured to inhibit deposition of a metal-containing layer. As a further example, the hard mask layer may comprise a surface region pretreated with a material that inhibits deposition of a metal-containing layer, with the pretreatment occurring prior to formation of the resist layer over the pretreated surface region of the hard mask layer. These and other embodiments can allow for increased height of the resist layer, thereby avoiding problems that might otherwise arise due to resist thinning during etching of the hard mask layer. Moreover, illustrative embodiments provide enhanced etch selectivity and associated improvements in pattern transfer between the resist layer and the hard mask layer. This can in turn lead to lower defect rates in lithographic patterning and corresponding reductions in integrated circuit manufacturing costs.

Figure 3:
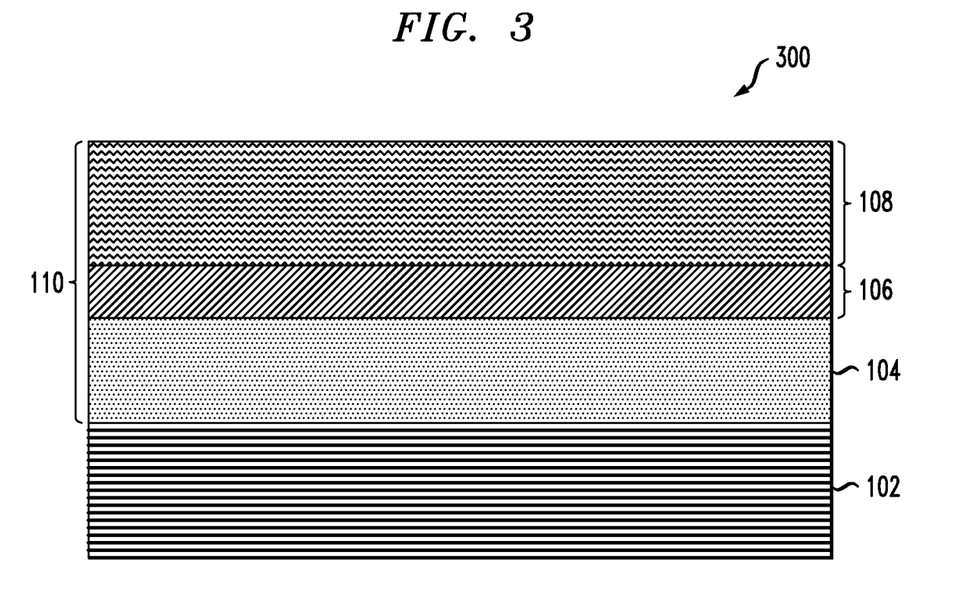
FIG. 3 shows a cross-sectional view of a semiconductor structure following formation of a resist layer over a hard mask layer in an illustrative embodiment.
Figure 4:
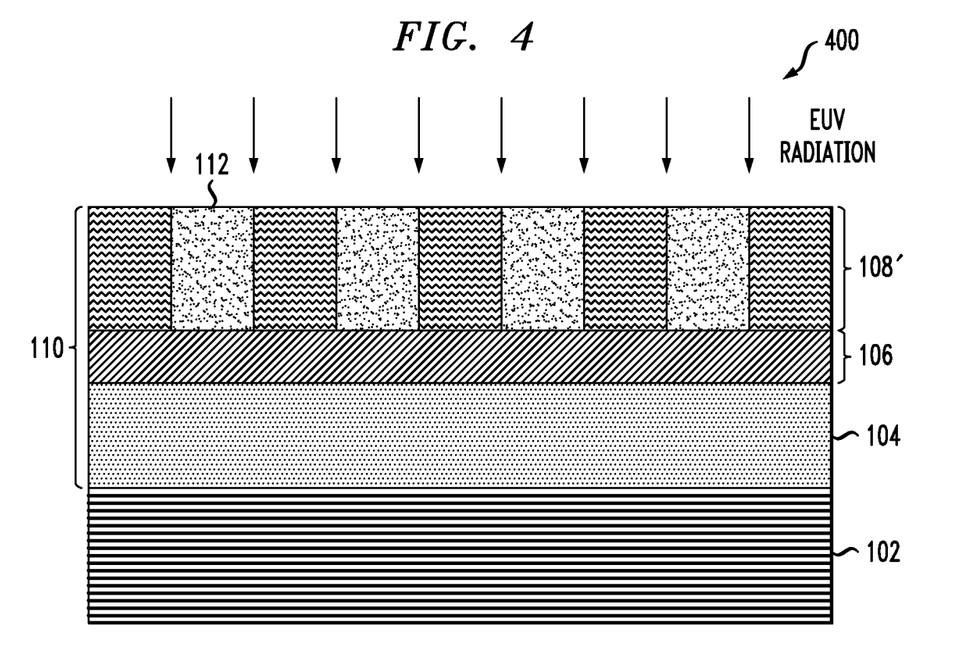
FIG. 4 shows a cross-sectional view of a semiconductor structure under exposure to EUV radiation in conjunction with patterning of a resist layer in an illustrative embodiment.
Figure 5A:
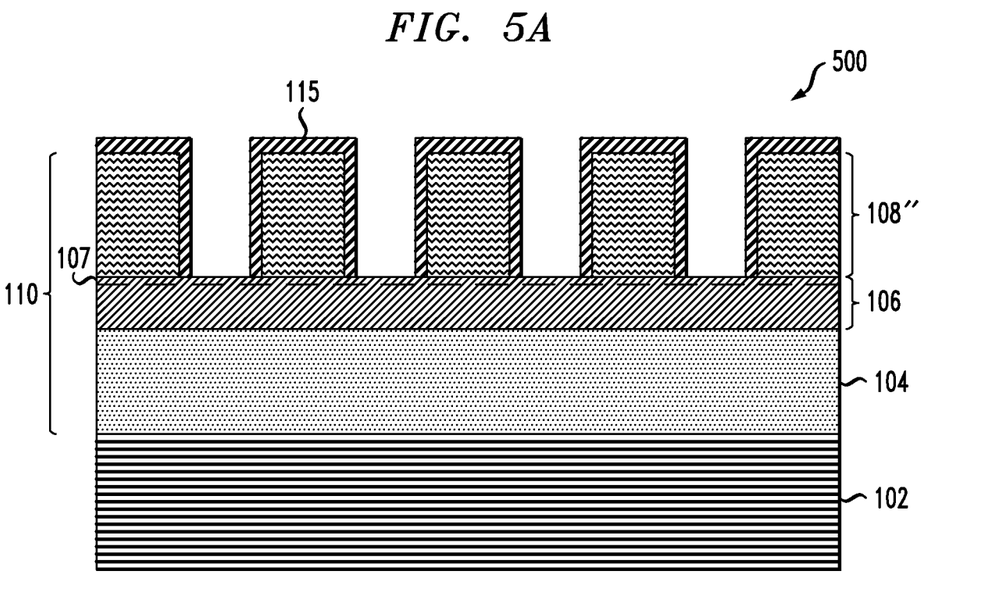
FIG. 5A shows a cross-sectional view of a semiconductor structure after development of a pattern in a resist layer and selective deposition of a metal-containing layer on the developed pattern in the resist layer based on a pretreated surface region of an underlying hard mask layer in an illustrative embodiment.
Figure 5B:
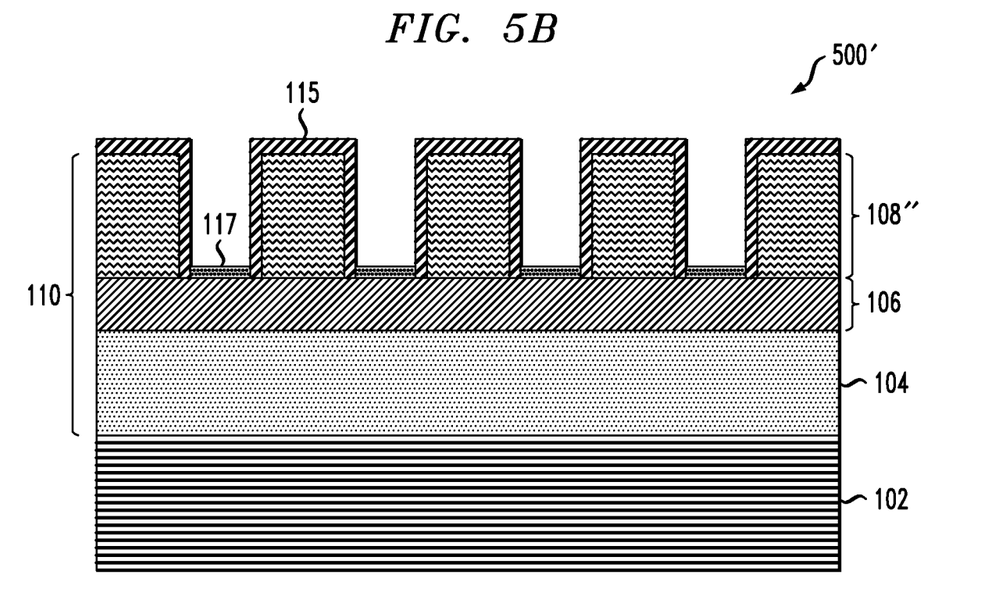
FIG. 5B shows a cross-sectional view of a semiconductor structure after development of a pattern in a resist layer and selective deposition of a metal-containing layer on the developed pattern in the resist layer based on grafting of material to portions of an underlying hard mask layer corresponding to respective openings in the resist layer in an illustrative embodiment.

FIGS. 1 through 7 show a portion of an EUV lithography process involving the formation of a hard mask layer configured to support selective deposition of a metal-containing layer on a patterned resist layer in an illustrative embodiment. The EUV lithography process is applied to a semiconductor wafer in conjunction with the manufacture of integrated circuits. The figures illustrate respective cross-sectional views of a portion of the semiconductor wafer as it undergoes sequential processing operations as part of the EUV lithography process. FIG. 5 includes two distinct figures, denoted as FIGS. 5A and 5B, corresponding to different hard mask layer configuration options within the process of FIGS. 1 to 7. It is to be appreciated that the various elements and other features shown in these figures are simplified for clarity and simplicity of illustration and are not necessarily drawn to scale.

It should also be noted that references herein to formation of one layer or structure "on" or "over" another layer or structure are intended to be broadly construed, and should not be interpreted as precluding the presence of one or more intervening layers or structures.

Figure 1:
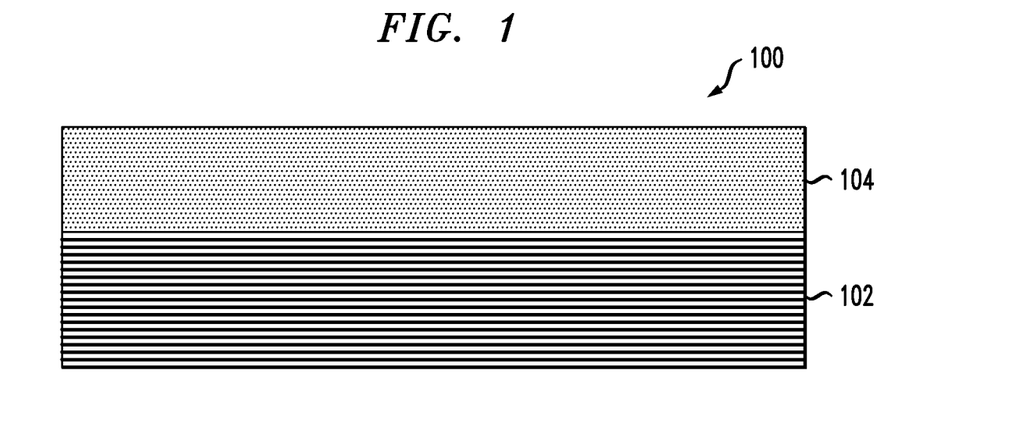
FIG. 1 shows a cross-sectional view of a semiconductor structure following formation of an organic planarizing layer on a semiconductor substrate in an illustrative embodiment.

Referring initially to FIG. 1, a semiconductor structure 100 represents a portion of a semiconductor wafer having a semiconductor substrate 102. At least portions of the semiconductor substrate 102 may be formed of silicon (Si), and may have a thickness of about 500 to 1000 micrometers (µm). The semiconductor substrate 102 may itself comprise multiple layers, although it is shown as a single layer in the figure, again for clarity and simplicity of illustration. The semiconductor structure 100 further comprises an organic planarizing layer (OPL) 104. The OPL 104 in some embodiments is formed to a thickness of approximately 60 nm, although these and other dimensions are presented herein as illustrative examples and should not be construed as limiting. The OPL 104 in the present embodiment is a lower-most layer of what is referred to herein as a "multi-layer patterning material film stack," although such a film stack in other embodiments need not include OPL 104.

Figure 2:
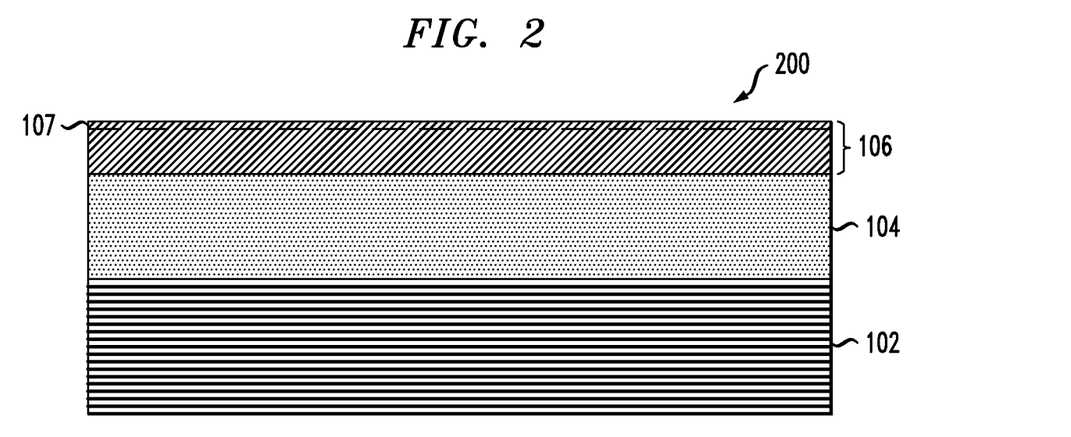
FIG. 2 shows a cross-sectional view of a semiconductor structure following formation of a hard mask layer over an organic planarizing layer in an illustrative embodiment.

As shown in FIG. 2, a hard mask layer 106 is formed over the OPL 104, resulting in the semiconductor structure 200. The hard mask layer 106 is illustratively formed of silicon-based materials such as silicon oxide, silicon nitride, silicon oxynitride, silicon oxycarbide, or amorphous silicon (aSi), although a wide variety of other inorganic or organic materials could be used. The hard mask layer 106 in this embodiment is a second layer of the multi-layer patterning material film stack, overlying the OPL 104. The hard mask layer 106 may have a thickness in the range of about 3 nm to 15 nm.

The hard mask layer 106 is illustratively formed at least in part by a deposition process, such as atomic layer deposition (ALD), chemical vapor deposition (CVD) or physical vapor deposition (PVD). Such deposition processes are followed in some embodiments by surface pretreatment processes and/or material grafting processes, as will be described in more detail below.

The hard mask layer 106 in this embodiment is configured to support selective deposition of a metal-containing layer on a resist layer, with the selective deposition of the metal-containing layer on the resist layer occurring after pattern development, as will be described below in conjunction with FIGS. 5A and 5B. At this stage in the process, the hard mask layer 106 may be configured to support the selective deposition of the metal-containing layer on the patterned resist layer through inclusion in the hard mask layer 106 of one or more materials inhibiting deposition of the metal-containing layer. For example, the hard mask layer 106 may be pretreated with a material that inhibits deposition of the metal-containing layer. This illustratively produces a pretreated surface region 107 in the hard mask layer 106 that tends to inhibit deposition of the metal-containing layer on portions of the hard mask layer 106 that are subsequently exposed through respective openings in the patterned resist layer. An example of such inhibited deposition of the metal-containing layer based on pretreated surface region 107 is shown in FIG. 5A.

The pretreatment of the hard mask layer 106 to support selective deposition of the metal-containing layer on a patterned resist layer occurs prior to forming the resist layer over the hard mask layer 106. For example, the pretreatment may comprise applying a plasma treatment with fluorine implantation to the surface of the hard mask layer 106 prior to forming the resist layer over the hard mask layer 106.

Additional details regarding examples of plasma treatments that can be adapted for use in pretreatment embodiments of the present invention can be found in A. Haider et al., "Area-Selective Atomic Layer Deposition Using an Inductively Coupled Plasma Polymerized Fluorocarbon Layer: A Case Study for Metal Oxides," J. Phys. Chem. C, 2016, 120 (46), pp. 26393-26401, which is incorporated by reference herein.

In other embodiments, the hard mask layer 106 is configured to support selective deposition of a metal-containing layer on a patterned resist layer through inclusion in the hard mask layer 106 of a grafted self-assembled monolayer. The grafted self-assembled monolayer is illustratively configured to inhibit deposition of the metal-containing layer.

Additionally or alternatively, the hard mask layer 106 is configured to support selective deposition of a metal-containing layer on a patterned resist layer through inclusion in the hard mask layer 106 of grafted polymer brush material, with the grafted polymer brush material being configured to inhibit deposition of the metal-containing layer. An example of polymer brush material that may be grafted to the hard mask layer 106 is polysulfone, although other types of materials can be used.

Materials such as self-assembled monolayers and polymer brush material that are grafted to the hard mask layer 106 are described herein as being part of the hard mask layer 106. The grafting of such materials may be performed on portions of the hard mask layer 106 that are exposed through respective openings in the patterned resist layer. An example of this type of inhibited deposition of the metal-containing layer using self-assembled monolayers, polymer brush material or other materials grafted to portions of the hard mask layer 106 in respective openings in the patterned resist layer is shown in FIG. 5B.

The configuration of the hard mask layer 106 to support selective deposition of a metal-containing layer on a patterned resist layer as disclosed herein provides significant advantages over conventional arrangements. For example, the hard mask layer 106 when so configured can allow for increased height of the resist layer, as well as enhanced etch selectivity and associated improvements in pattern transfer between the resist layer and the hard mask layer. Such arrangements reduce pattern transfer defects such as line breaks that might otherwise occur due to resist thinning during an etching process. In some embodiments, configuration of the hard mask layer 106 to support selective deposition of a metal-containing layer on a patterned resist layer also helps to eliminate line bridge defects by increasing the margin for removal of resist scumming between resist lines. As mentioned previously, a resist descum process used for this purpose tends to reduce the resist thickness available for hard mask etch.

Accordingly, illustrative embodiments can facilitate the achievement of desired patterned feature resolutions and associated patterning quality metrics such as line edge roughness (LER) and line width roughness (LWR).

Although the surface region 107 and the other portions of the hard mask layer 106 in this embodiment are illustrated as respective separate regions separated by a horizontal dashed line in the figure, this is for clarity and simplicity of illustration only. The transition between the regions may in practice be a gradual one. In addition, the regions may have different shapes and configurations in other embodiments. Accordingly, the term "surface region" as used herein with reference to a hard mask layer is intended to be broadly construed, so as to encompass regions of various shapes or configurations that are proximate to an upper surface of the hard mask layer over which a resist layer is formed.

Turning now to FIG. 3, a resist layer 108 is formed over the hard mask layer 106, resulting in the semiconductor structure 300. This structure 300 includes a multi-layer patterning material film stack 110 that includes the OPL 104, the hard mask layer 106 and the resist layer 108. The resist layer comprises a photosensitive material suitable for patterning using a EUV radiation source and a corresponding photomask. The resist layer 108 illustratively comprises an organic EUV photoresist, and more particularly an organic chemically-amplified photoresist, although other types of resist materials can be used. The resist layer 108 may have a thickness in the range of about 10 nm to 30 nm. The resist layer 108 may be subject to a post-application bake (PAB) process, at a temperature of about 150° C., although other processes can be used.

In other embodiments, the multi-layer patterning material film stack 110 can include additional or alternative layers underlying the resist layer 108. Accordingly, the particular multi-layer patterning material film stack 110 shown in the figure is presented by way of illustrative example only. A given such film stack will generally comprise a resist layer formed over one or more additional layers including at least a hard mask layer. The one or more additional layers in the present example comprise the OPL 104 and the hard mask layer 106, although once again other additional or alternative layers can be used.

Referring now to FIG. 4, the multi-layer patterning material film stack 110 is exposed to EUV patterning radiation to form a desired pattern in the resist layer 108. The pattern includes features such as feature 112. The resulting semiconductor structure 400 includes a patterned resist layer denoted by reference numeral 108' in the figure. The patterned resist layer 108' is then developed using a developer solution. In some embodiments, a resist descum process is used after forming the patterned resist layer 108' in order to remove resist scumming between resist lines. For example, a plasma-based resist scum removal process may be used. These and other resist descum processes tend to reduce the thickness of the patterned resist layer 108'.

Development of the patterned resist layer 108' results in a developed resist layer 108" as shown in one of respective semiconductor structures 500 and 500' of respective FIGS. 5A and 5B in which portions of the resist layer are removed in accordance with the desired pattern, followed by selective deposition of a metal-containing layer 115. The developed resist layer 108" is also considered a type of "patterned resist layer" as the latter term is broadly used herein. The difference between the patterned resist layers 108' and 108" is that the former is prior to pattern development and the latter is subsequent to pattern development. The metal-containing layer 115 in the present embodiments is assumed to be selectively deposited on the developed pattern of the post-development resist layer 108". The metal-containing layer 115 illustratively has a thickness in the range of about 2 nm to 5 nm.

The metal-containing layer 115 in the present embodiment is assumed to comprise a metal or metal oxide layer, although other types of materials can be used. For example, in some embodiments, the metal-containing layer may comprise a metal-containing fluorinated polymer, although other types of materials as well as combinations of multiple distinct materials can be used. In embodiments in which the metal-containing layer 115 comprises a metal-containing fluorinated polymer, the hard mask layer 106 is configured to inhibit deposition of the metal-containing fluorinated polymer, possibly through the use of grafting material exhibiting a low sticking coefficient to fluorinated polymers.

The metal-containing layer 115 is selectively deposited using an ALD process, such as a plasma-enhanced ALD (PEALD) process or a thermal ALD process, although other selective deposition processes can be used. In some embodiments, the metal-containing layer 115 is selectively deposited in an etch chamber prior to etching the hard mask layer 106 in accordance with the developed pattern formed in the resist layer 108.

In the FIG. 5A embodiment, metal-containing layer 115 is selectively deposited over the developed resist layer 108" based on pretreatment of surface region 107 of the hard mask layer 106 of the semiconductor structure 500. For example, the hard mask layer 106 in this embodiment is configured to support selective deposition of the metal-containing layer 115 on the developed resist layer 108" by pretreating surface region 107 of the hard mask layer 106 with a material that inhibits deposition of the metal-containing layer, as previously described in conjunction with FIG. 2. This may involve applying a plasma treatment with fluorine implantation to the surface region 107 of the hard mask layer 106 prior to forming the resist layer 108 over the hard mask layer 106. The pretreatment of surface region 107 is configured so as to not adversely impact selectivity of an etchant to the resist and OPL layers relative to the hard mask layer during a subsequent etching process.

In the FIG. 5B embodiment, metal-containing layer 115 is selectively deposited over the developed resist layer 108" of the semiconductor structure 500' based on grafting of material 117 to portions of the hard mask layer 106 corresponding to respective openings in the developed resist layer 108" with the grafting occurring prior to selective deposition of the metal-containing layer 115. The grafted material 117 is assumed to be part of the hard mask layer 106 in this embodiment, and illustratively comprises at least one of a grafted self-assembled monolayer and grafted polymer brush material.

For example, configuring the hard mask layer 106 to support selective deposition of the metal-containing layer 115 in the FIG. 5B embodiment comprises grafting a self-assembled monolayer to at least part of the hard mask layer 106 prior to selectively depositing the metal-containing layer 115. More particularly, this may involve grafting the self-assembled monolayer to portions of the hard mask layer 106 corresponding to respective openings in the developed resist layer 108" prior to selectively depositing the metal-containing layer 115. The self-assembled monolayer is illustratively configured to inhibit deposition of the metal-containing layer 115. Accordingly, formation of the metal-containing layer 115 is generally restricted to exposed surfaces of the developed resist layer 108".

As another example, configuring the hard mask layer 106 to support selective deposition of the metal-containing layer 115 in the FIG. 5B embodiment comprises grafting polymer brush material to at least part of the hard mask layer 106 prior to selectively depositing the metal-containing layer 115. More particularly, this may involve grafting the polymer brush material to the portions of the hard mask layer 106 corresponding to respective openings in the developed resist layer 108" prior to selectively depositing the metal-containing layer 115. The polymer brush material is illustratively configured to inhibit deposition of the metal-containing layer 115. Again, formation of the metal-containing layer 115 is thereby generally restricted to exposed surfaces of the developed resist layer 108". The polymer brush material illustratively comprises a material such as polysulfone, although other materials can be used.

The self-assembled monolayer and/or polymer brush material as described above are grafted to the hard mask layer 106 by chemical attachment to the hard mask layer 106. Accordingly, the particular configuration of the self-assembled monolayer and/or polymer brush material used as grafted material 117 in some embodiments may be selected at least in part based on the material used to form the hard mask layer 106.

For example, in the case of an $SiO_2$ or SiON hard mask layer, self-assembled monolayer and/or polymer brush material comprising hydroxyl or trimethoxysilyl type groups will readily graft to the $SiO_2$ or SiON hard mask layer. Additionally or alternatively, in the case of an oxide hard mask layer, a grafting material comprising an $NH_2$ terminated group may be used for low temperature grafting to the oxide hard mask layer.

As another example, in the case of an aSi hard mask layer, self-assembled monolayer and/or polymer brush material comprising propargyl groups will readily graft to the aSi hard mask layer. Grafting materials comprising other types of alkyne-based groups may also be used for selective grafting to the aSi hard mask layer.

In other possible implementations of the FIG. 5B embodiment, configuring the hard mask layer 106 to support selective deposition of the metal-containing layer 115 on the developed resist layer 108" comprises configuring at least part of the hard mask layer 106 to include material comprising a hydrophobic end group prior to selectively depositing the metal-containing layer 115. Materials other than grafted self-assembled monolayers or grafted polymer brush material can therefore be used, including alternative materials that can form a hydrophobic end group on at least portions of the hard mask layer 106. Such a hydrophobic end group is not conducive to growth of atomic layer deposition of metal films.

The grafted material 117 in the FIG. 5B embodiment is illustratively removed prior to or in conjunction with performing an etching process to transfer the developed resist pattern to the hard mask layer 106. Accordingly, such grafted material can be removed as part of an etching process.

Figure 6:
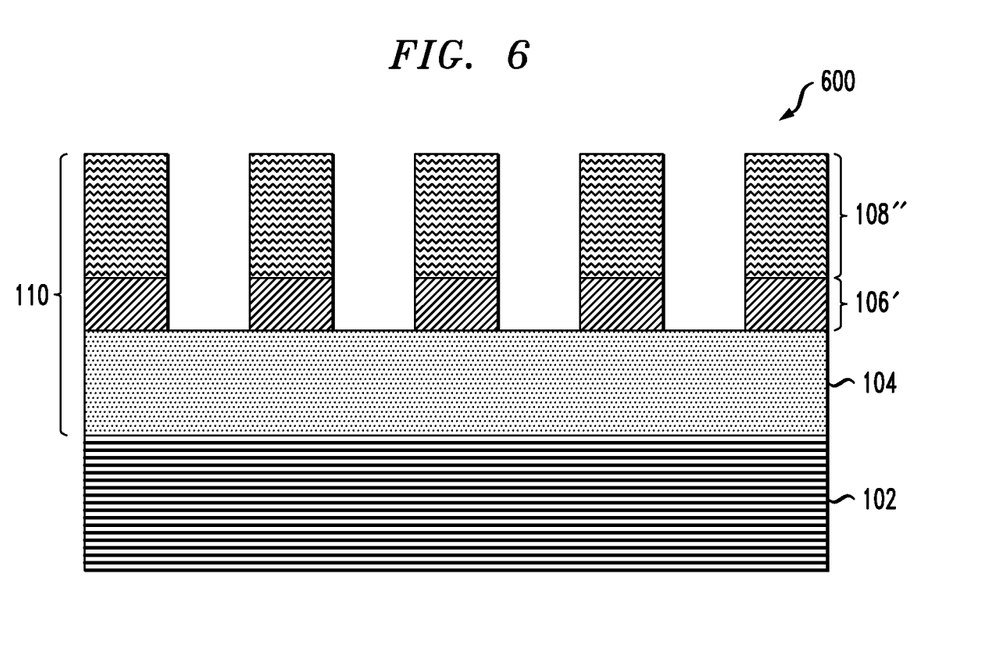
FIG. 6 shows a cross-sectional view of a semiconductor structure following etching of a hard mask layer in accordance with a pattern formed in a resist layer in an illustrative embodiment.

As shown in FIG. 6, the hard mask layer 106 underlying the developed resist layer 108" is etched in accordance with the developed pattern to produce the semiconductor structure 600. This part of the process results in transfer of the pattern from the developed resist layer 108" to patterned hard mask layer 106' as shown. The etching can be performed using a process such as reactive ion etching (RIE) or wet etching. It is assumed in this embodiment that the metal-containing layer 115 is fully removed as a result of the etching process, although this need not be the case in other embodiments.

Figure 7:
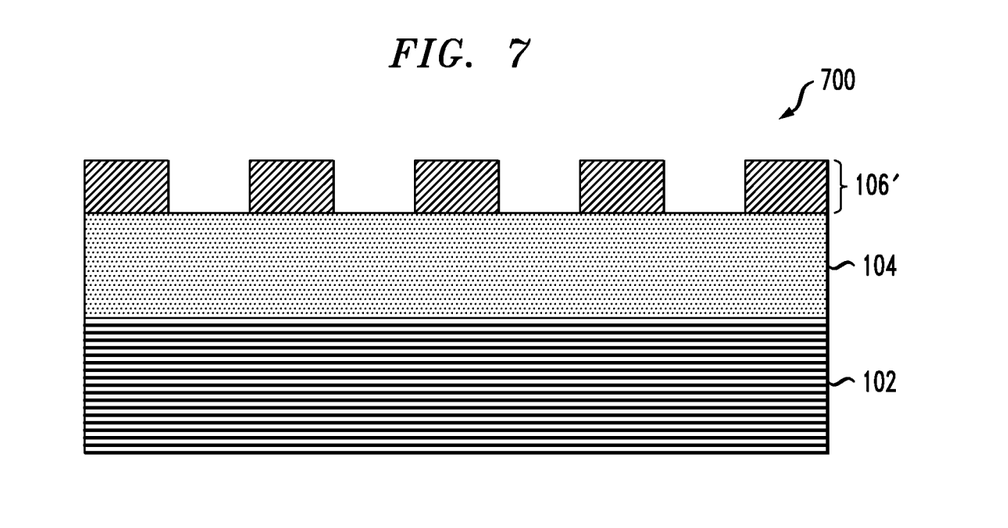
FIG. 7 shows a cross-sectional view of a semiconductor structure showing an etched hard mask layer after removal of remaining portions of a resist layer in an illustrative embodiment.

Remaining portions of the developed resist layer 108" are then removed, as shown in FIG. 7, resulting in the semiconductor structure 700. Portions of the metal-containing layer 115 remaining after the etching process, if there are any such portions, may also be removed at this stage, although such remaining portions of the metal-containing layer 115 are not illustrated in the figures. The semiconductor structure 700 is then subject to additional processing operations of a type well known to those skilled in the art, in order to form desired integrated circuit structures on the semiconductor wafer. For example, portions of the process as previously described in conjunction with FIGS. 1 through 7 can be repeated with different pattern masks in order to further configure the hard mask layer in accordance with additional pattern features.

In other embodiments, other types of multi-layer patterning material film stacks may be used. For example, in some embodiments, additional or alternative layers may be included in the patterning material film stack with the hard mask layer and the resist layer. These and numerous other lithographic patterning arrangements using a hard mask layer configured to support selective deposition of a metal-containing layer on a patterned resist layer can be implemented using the techniques disclosed herein, as will be appreciated by those skilled in the art.

Illustrative embodiments can include a semiconductor structure comprising a semiconductor substrate and a multi-layer patterning material film stack formed on the semiconductor substrate. The patterning material film stack comprises at least a hard mask layer and a resist layer formed over the hard mask layer. The hard mask layer is configured to support selective deposition of a metal-containing layer on a developed pattern of the resist layer through inclusion in the hard mask layer of one or more materials inhibiting deposition of the metal-containing layer on portions of the hard mask layer corresponding to respective openings in the resist layer.

Other illustrative embodiments can include a multi-layer patterning material film stack comprising a hard mask layer and a resist layer formed over the hard mask layer. The hard mask layer is configured to support selective deposition of a metal-containing layer on a developed pattern of the resist layer through inclusion in the hard mask layer of one or more materials inhibiting deposition of the metal-containing layer on portions of the hard mask layer corresponding to respective openings in the resist layer. The hard mask layer may be formed over a semiconductor substrate or on other types of substrates, layers or materials.

Additional illustrative embodiments include lithography tools and other types of lithographic patterning equipment that are configured to perform lithographic processes such as those described above in conjunction with the manufacture of semiconductor integrated circuits. For example, an EUV lithography tool such as the ASML NXE:3300B or NXE:3350B operating at a wavelength of 13.5 nm can be modified to perform an EUV lithography process of the type described above, where such a lithography process includes forming a hard mask layer configured to support selective deposition of a metal-containing layer on a patterned resist layer using the techniques disclosed herein. Again, other types of lithography processes and associated lithography tools can be used, based on patterning radiation at DUV wavelengths or other wavelengths, and the techniques disclosed herein are therefore not limited to use with EUV lithography processes or EUV lithography tools.

Examples of integrated circuit structures that can be formed using EUV lithography processes as disclosed herein include nanosheet metal-oxide-semiconductor field-effect transistor (MOSFET) devices. The use of a hard mask layer configured to support selective deposition of a metal-containing layer over a patterned resist layer as disclosed herein can facilitate the manufacture of such devices by allowing an increase in resist height while also avoiding pattern transfer defects such as line breaks, thereby facilitating the formation of sub-10 nm features. Similar improvements are provided for alternative ranges of feature sizes, such as sub-50 nm features. A wide variety of other types of integrated circuit devices can be fabricated using an EUV lithography process that includes one or more iterations of at least portions of the steps shown in FIGS. 1 through 7.

In the description above, various materials and dimensions for different elements are provided. Unless otherwise noted, such materials are given by way of example only and embodiments are not limited solely to the specific examples given. Similarly, unless otherwise noted, all dimensions are given by way of example and embodiments are not limited solely to the specific dimensions or ranges given.

It is to be understood that the various layers, structures, and/or regions described above are not necessarily drawn to scale. In addition, for ease of explanation one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular processing steps shown and described herein. In particular, with respect to semiconductor processing steps, it is to be emphasized that the descriptions provided herein are not intended to encompass all of the processing steps that may be used to form a functional semiconductor integrated circuit device. Rather, certain processing steps that are commonly used in forming semiconductor devices, such as, for example, wet cleaning and annealing steps, are purposefully not described herein for economy of description.

Terms such as "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Also, in the figures, the illustrated scale of one layer, structure, and/or region relative to another layer, structure, and/or region is not necessarily intended to represent actual scale.

Semiconductor devices and methods for forming same in accordance with the above-described techniques can be employed in various applications, hardware, and/or electronic systems, including but not limited to personal computers, communication networks, electronic commerce systems, portable communications devices (e.g., cell and smart phones), solid-state media storage devices, functional circuitry, etc. Given the teachings provided herein, one of ordinary skill in the art will be able to contemplate other implementations and applications of embodiments of the invention.

In some embodiments, the above-described techniques are used in connection with manufacture of semiconductor integrated circuit devices that illustratively comprise, by way of non-limiting example, CMOS devices, MOSFET devices, and/or FinFET devices, and/or other types of semiconductor integrated circuit devices that incorporate or otherwise utilize CMOS, MOSFET, and/or FinFET technology.

Accordingly, at least portions of one or more of the semiconductor structures described herein may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A lithographic patterning method, comprising:
    forming a multi-layer patterning material film stack on a semiconductor substrate, wherein forming the patterning material film stack comprises forming a hard mask layer and forming a resist layer over the hard mask layer, and wherein the hard mask layer is configured to support selective deposition of a metal-containing layer on the resist layer, the selective deposition of the metal-containing layer on the resist layer occurring after pattern development, wherein configuring the hard mask layer to support selective deposition of the metal-containing layer on the resist layer comprises grafting a self-assembled monolayer to at least part of the hard mask layer prior to selectively depositing the metal-containing layer;
    exposing the multi-layer patterning material film stack to patterning radiation to form a desired pattern in the resist layer;
    developing the pattern formed in the resist layer;
    selectively depositing the metal-containing layer on the developed pattern in the resist layer, wherein the selective deposition avoids deposition of the metal-containing layer on portions of the hard mask layer corresponding to respective openings in the resist layer, responsive to configuration of the hard mask layer;
    etching the hard mask layer in accordance with the developed pattern; and
    removing remaining portions of at least one of the resist layer and the metal-containing layer.

2. The method of claim 1 wherein the multi-layer patterning material film stack comprises one or more additional layers including at least an organic planarizing layer, and wherein the hard mask layer is formed over the organic planarizing layer.

3. The method of claim 1 wherein the metal-containing layer has a thickness in a range from about 2 nanometers to about 5 nanometers.

4. The method of claim 1 wherein selectively depositing the metal-containing layer comprises selectively depositing the metal-containing layer using an atomic layer deposition (ALD) process comprising one of a plasma-enhanced ALD (PEALD) process and a thermal ALD process.

5. The method of claim 1 wherein configuring the hard mask layer to support selective deposition of the metal-containing layer on the resist layer comprises grafting the self-assembled monolayer to the portions of the hard mask layer corresponding to respective openings in the resist layer prior to selectively depositing the metal-containing layer.

6. The method of claim 1 wherein the self-assembled monolayer is configured to inhibit deposition of the metal-containing layer.

7. The method of claim 1 wherein configuring the hard mask layer to support selective deposition of the metal-containing layer on the resist layer comprises configuring at least part of the hard mask layer to include material comprising a hydrophobic end group prior to selectively depositing the metal-containing layer.

8. The method of claim 1 wherein configuring the hard mask layer to support selective deposition of the metal-containing layer on the resist layer comprises pretreating a surface region of the hard mask layer with a material that inhibits deposition of the metal-containing layer, and wherein the pretreating occurs prior to forming the resist layer over the hard mask layer.

9. The method of claim 8 wherein pretreating a surface region of the hard mask layer with a material that inhibits deposition of the metal-containing layer further comprises applying a plasma treatment with fluorine implantation to the surface region of the hard mask layer prior to forming the resist layer over the hard mask layer.

10. A lithographic patterning method, comprising:
    forming a multi-layer patterning material film stack on a semiconductor substrate, wherein forming the patterning material film stack comprises forming a hard mask layer and forming a resist layer over the hard mask layer, and wherein the hard mask layer is configured to support selective deposition of a metal-containing layer on the resist layer, the selective deposition of the metal-containing layer on the resist layer occurring after pattern development, wherein configuring the hard mask layer to support selective deposition of the metal-containing layer on the resist layer comprises grafting a polymer brush material to at least part of the hard mask layer prior to selectively depositing the metal-containing layer;
    exposing the multi-layer patterning material film stack to patterning radiation to form a desired pattern in the resist layer;
    developing the pattern formed in the resist layer;
    selectively depositing the metal-containing layer on the developed pattern in the resist layer, wherein the selective deposition avoids deposition of the metal-containing layer on portions of the hard mask layer corresponding to respective openings in the resist layer, responsive to configuration of the hard mask layer;
    etching the hard mask layer in accordance with the developed pattern; and
    removing remaining portions of at least one of the resist layer and the metal-containing layer.

11. The method of claim 10 wherein configuring the hard mask layer to support selective deposition of the metal-containing layer on the resist layer comprises grafting the polymer brush material to the portions of the hard mask layer corresponding to respective openings in the resist layer prior to selectively depositing the metal-containing layer.

12. The method of claim 10 wherein the polymer brush material is configured to inhibit deposition of the metal-containing layer.

13. The method of claim 10 wherein the polymer brush material comprises polysulfone.

14. The method of claim 10 wherein the multi-layer patterning material film stack comprises one or more additional layers including at least an organic planarizing layer, and wherein the hard mask layer is formed over the organic planarizing layer.

15. The method of claim 10 wherein the metal-containing layer has a thickness in a range from about 2 nanometers to about 5 nanometers.

16. The method of claim 10 wherein selectively depositing the metal-containing layer comprises selectively depositing the metal-containing layer using an atomic layer deposition (ALD) process comprising one of a plasma-enhanced ALD (PEALD) process and a thermal ALD process.

17. The method of claim 10 wherein configuring the hard mask layer to support selective deposition of the metal-containing layer on the resist layer comprises configuring at least part of the hard mask layer to include material comprising a hydrophobic end group prior to selectively depositing the metal-containing layer.

18. The method of claim 10 wherein configuring the hard mask layer to support selective deposition of the metal-containing layer on the resist layer comprises pretreating a surface region of the hard mask layer with a material that inhibits deposition of the metal-containing layer, and wherein the pretreating occurs prior to forming the resist layer over the hard mask layer.

19. The method of claim 18 wherein pretreating a surface region of the hard mask layer with a material that inhibits deposition of the metal-containing layer further comprises applying a plasma treatment with fluorine implantation to the surface region of the hard mask layer prior to forming the resist layer over the hard mask layer.

20. The method of claim 10 wherein the metal-containing layer comprises a metal-containing fluorinated polymer.

* * * * *